United States Patent
Okada et al.

(10) Patent No.: US 10,504,817 B2
(45) Date of Patent: Dec. 10, 2019

(54) SEMICONDUCTOR DEVICE

(71) Applicant: Mitsubishi Electric Corporation, Tokyo (JP)

(72) Inventors: Kazuya Okada, Tokyo (JP); Hiroki Muraoka, Tokyo (JP); Koichi Masuda, Tokyo (JP); Yasutaka Shimizu, Tokyo (JP); Shoji Izumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/004,769

(22) Filed: Jun. 11, 2018

(65) Prior Publication Data

US 2019/0074238 A1 Mar. 7, 2019

(30) Foreign Application Priority Data

Sep. 6, 2017 (JP) ................. 2017-170854

(51) Int. Cl.
*H01L 23/40* (2006.01)
*H01L 23/04* (2006.01)
*H01L 23/433* (2006.01)
*H01L 23/373* (2006.01)

(52) U.S. Cl.
CPC .......... *H01L 23/4006* (2013.01); *H01L 23/04* (2013.01); *H01L 23/3735* (2013.01); *H01L 23/433* (2013.01); *H01L 2023/4025* (2013.01); *H01L 2023/4043* (2013.01); *H01L 2023/4068* (2013.01); *H01L 2023/4087* (2013.01); *H01L 2224/48091* (2013.01); *H01L 2224/73265* (2013.01); *H01L 2924/19107* (2013.01)

(58) Field of Classification Search
CPC .................................. H01L 23/4006
See application file for complete search history.

(56) References Cited

U.S. PATENT DOCUMENTS

2014/0124915 A1* 5/2014 Hayashi ................. H01L 25/18
257/713

FOREIGN PATENT DOCUMENTS

| JP | H04-233752 A | 8/1992 |
|----|----|----|
| JP | 2505196 Y2 | 7/1996 |
| JP | 2012-028552 A | 2/2012 |

* cited by examiner

*Primary Examiner* — William A Harriston
(74) *Attorney, Agent, or Firm* — Studebaker & Brackett PC

(57) ABSTRACT

Provided is a technique for improving product attachment. In a semiconductor device, the following expression is satisfied by an angle A formed by an imaginary line connecting two attachment holes together and an imaginary line connecting together a lowest point of one of two projections positioned in a surrounding portion of one of the two attachment holes and a contact point between a bulge and a heat sink, with a screw fastened to the heat sink through the one attachment hole, where M represents a vertical direction between the lower end of a body and the lower end of a case, where W represents a bulge amount of the bulge, where T represents a height of the projection, where L represents a horizontal distance from the outer peripheral end of the case to the outer peripheral end of the heat dissipation plate: $0 < A < \arctan((M+W-T)/L)$.

11 Claims, 12 Drawing Sheets

F I G . 1 2
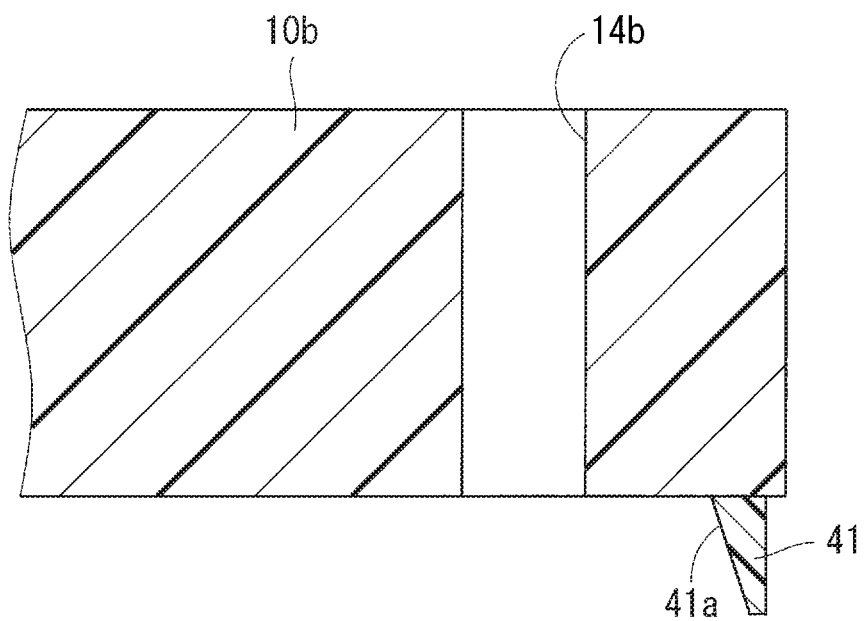
F I G . 1 3
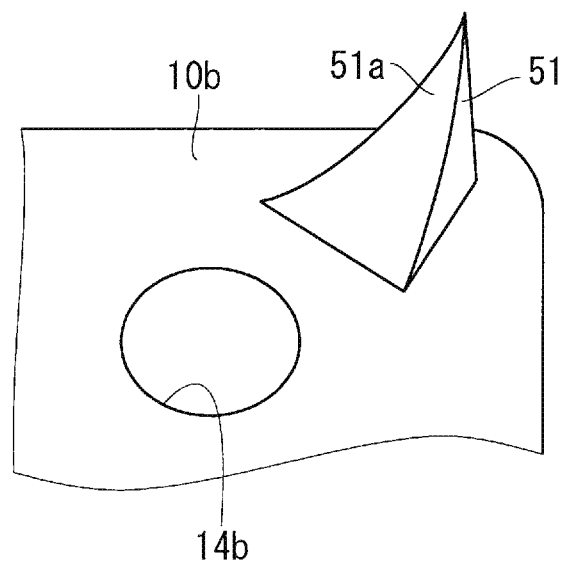

SEMICONDUCTOR DEVICE

BACKGROUND OF THE INVENTION

Field of the Invention

The present invention relates to semiconductor devices, and more particularly, to a power semiconductor device including a power chip.

Description of the Background Art

In a power semiconductor device including a power chip, efficiently dissipating heat generated in the power chip to an external structure, such as a heat sink is highly important. The use of a thermally conductive material enables efficient heat dissipation when the body of the semiconductor device is attached to the heat sink.

Provided is a structure in which the center portion of a heat dissipation plate provided with the power chip is brought into contact with the heat sink through screwing in order to accelerate heat dissipation from the thermally conductive material to the heat sink (e.g., Japanese Patent Application Laid-Open No. 4-233752 and Japanese Utility Model Application Laid-Open No. 4-46552).

The technique in Japanese Patent Application Laid-Open No. 4-233752 requires a flexible bottom plate or a flexible heat dissipation plate. The flexible heat dissipation plate unfortunately deteriorates a product with time.

In the technique in Japanese Utility Model Application Laid-Open No. 4-46552, a small projection is disposed between a through hole of an attachment surface of a resin covering a semiconductor pellet mounted on a heat dissipation plate, and an outer end portion adjacent to a thin part of the heat dissipation plate. The small projection enables tight attachment to an external radiator. This eliminates the need for a flexible heat dissipation plate. However, the technique in Japanese Utility Model Application Laid-Open No. 4-46552 involves unfavorable product attachment because the technique fails to reflect the warpage of the heat dissipation plate.

SUMMARY

It is an object of the present invention to provide a technique for improving product attachment.

A semiconductor device according to an aspect of the present invention includes a heat sink, a heat dissipation plate, a semiconductor element, and a case. The heat dissipation plate is disposed above the heat sink, and has a body that is flat shaped and a bulge bulging out from the lower end of the body in the form of an arc in cross-sectional view. The semiconductor element is disposed above the heat dissipation plate. The case encloses the semiconductor element, and is attached to the heat sink. The case has the following: an attachment portion extending outward from the outer periphery portion at the lower end portion of the case; two attachment holes disposed in positions opposite to each other in the attachment portion, and provided for attachment to the heat sink; and two projections individually projecting downward from the lower surface of the attachment portion in positions more adjacent to an outer periphery side of the attachment portion than the two attachment holes. The following expression is satisfied by an angle A formed by an imaginary line connecting the two attachment holes together and an imaginary line connecting together the lowest point of one of the two projections positioned in a surrounding portion of one of the two attachment holes and a contact point between the bulge and the heat sink, with a screw fastened to the heat sink through the one attachment hole, where M represents a vertical distance between the lower end of the body and the lower end of the case, where W represents a bulge amount of the bulge, where T represents a height of the projection, where L represents a horizontal distance from the outer peripheral end of the case to the outer peripheral end of the heat dissipation plate: $0<A<\arctan((M+W-T)/L)$.

The angle A is reduced. This prevents a location in which the other attachment hole in the attachment portion of the case is disposed from detaching upward from a surface of the heat sink. Consequently, the product attachment is improved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a cross-sectional view of the projection and its surrounding portion;

FIG. 13 is a perspective bottom view of a projection and its surrounding portion of a semiconductor device according to a fourth preferred embodiment;

DESCRIPTION OF THE PREFERRED EMBODIMENTS

First Preferred Embodiment

Figure 1:
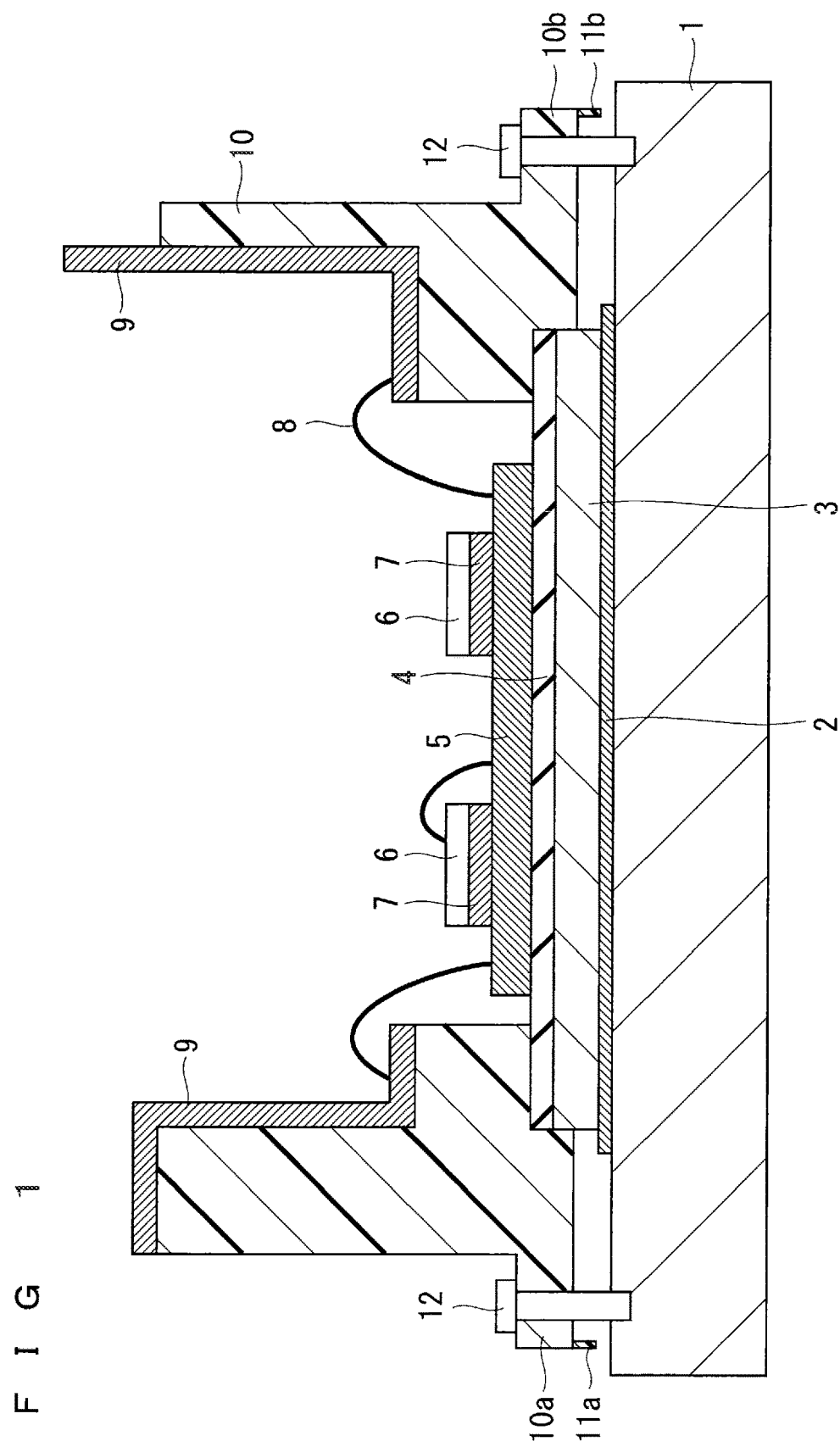
FIG. 1 is a cross-sectional view of a semiconductor device according to a first preferred embodiment.
Figure 2:
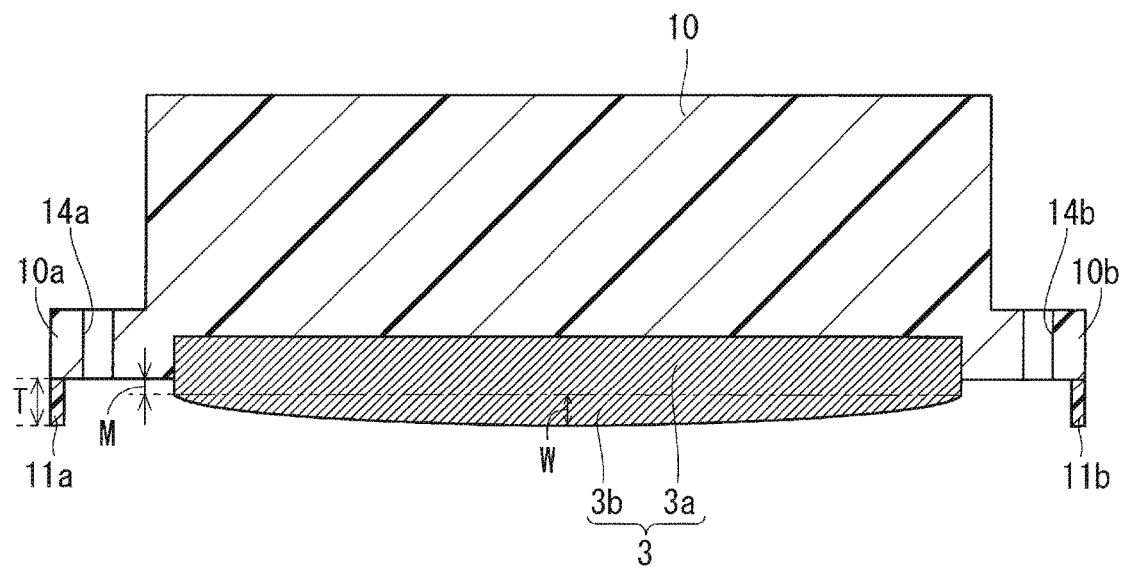
FIG. 2 is a cross-sectional view of the semiconductor device with a heat sink removed therefrom.
Figure 3:
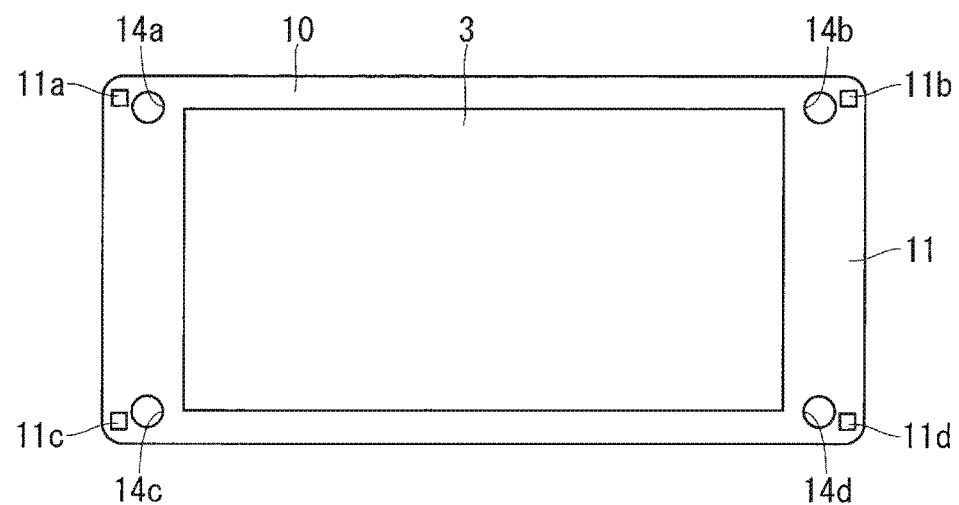
FIG. 3 is a bottom view of the semiconductor device with the heat sink removed therefrom.
Figure 4:
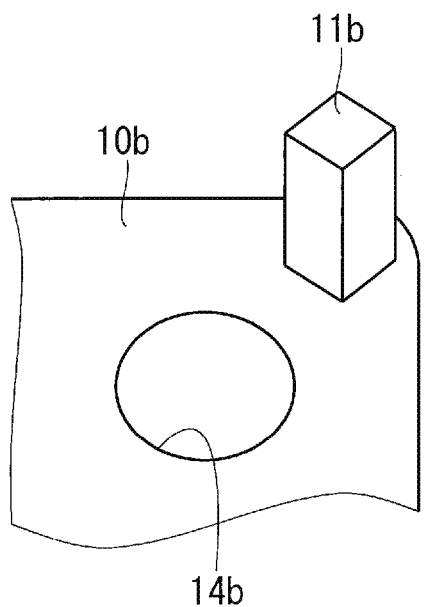
FIG. 4 is a perspective bottom view of a projection and its surrounding portion.

The following describes a first preferred embodiment of the present invention with reference to the drawings. FIG. 1 is a cross-sectional view of a semiconductor device according to the first preferred embodiment. FIG. 2 is a cross-sectional view of the semiconductor device with a heat sink 1 removed therefrom. FIG. 3 is a bottom view of the semiconductor device with the heat sink 1 removed therefrom. FIG. 4 is a perspective bottom view of a projection 11b and its surrounding portion.

As illustrated in FIG. 1, the semiconductor device is a power semiconductor device, and includes the heat sink 1, a heat dissipation plate 3, a plurality of semiconductor elements 6, a plurality of metal terminals 9, a case 10, and screws 12.

The heat dissipation plate 3 is disposed above the heat sink 1. More specifically, the heat dissipation plate 3 has a lower surface provided with a thermally conductive material 2, and is disposed on the upper surface of the heat sink 1 with the thermally conductive material 2 interposed therebetween. An example of the thermally conductive material 2 is grease.

The semiconductor elements 6 are disposed above the heat dissipation plate 3. More specifically, the heat dissipation plate 3 has an upper surface with an insulating substrate 4 fixed thereto; moreover, the insulating substrate 4 has an upper surface with a circuit pattern 5 disposed in a region excluding the end portions of the upper surface. Each semiconductor element 6 is a power chip, and mounted on the upper surface of the circuit pattern 5 with solder 7 interposed therebetween.

As illustrated in FIG. 2, the heat dissipation plate 3 includes a body 3a and a bulge 3b. The body 3a is flat shaped, and to be specific, has a shape defined by a region from the upper end of the heat dissipation plate 3 to an imaginary line. The bulge 3b bulges out from the lower end of the body 3a in the form of an arc in cross-sectional view. The center portion of the bulge 3b further bulges out than the end portions of the bulge 3b. The bulge 3b is provided to prevent a gap between a body of the semiconductor device and the heat sink 1 when the semiconductor device except the heat sink 1 (hereinafter referred to as a semiconductor device body) is attached to the heat sink 1 with the thermally conductive material 2, such as grease. The bulge 3b enables the attachment of the semiconductor device body with the center portion of the lower surface of the heat dissipation plate 3 pushing the grease toward an outer periphery side of the heat dissipation plate 3 when compared to a heat dissipation plate 3 having a flat lower surface. This prevents a gap between the semiconductor device body and the heat sink 1.

It is noted that an example of the heat dissipation plate 3 may be a resin-insulating copper base plate including a combination of a metal heat-dissipation plate and an insulating substrate in one piece. It is also noted that an example of the insulating substrate 4 is a ceramic material, such as alumina or aluminum nitride.

As illustrated in FIG. 1, the case 10 is made of a resin, such as a PPS, and fixed to the end portions of each of the insulating substrate 4 and the heat dissipation plate 3 with an adhesive so as to enclose the semiconductor elements 6. The metal terminals 9 are attached to the case 10 and connected to the circuit pattern 5 and the semiconductor elements 6 through wires 8. The case 10 is filled with a sealing resin, which is not shown. The sealing resin seals the semiconductor elements 6.

The following describes a distinctive structure of the case 10. As illustrated in FIGS. 1 to 3, the case 10 includes two attachment portions 10a and 10b, four attachment holes 14a, 14b, 14c, and 14d, and four projections 11a, 11b, 11c, and 11d. The two attachment portions 10a and 10b extend outward from the outer periphery portion at the lower end portions of the case 10. More specifically, the attachment portion 10a extend leftward; and the attachment portion 10b, rightward.

As illustrated in FIG. 3, the attachment holes 14a, 14b, 14c, and 14d are screw holes in which the screws 12 are engaged to attach the case 10 to the heat sink 1. The attachment holes 14a and 14c are respectively disposed in the front and rear end portions of the attachment portion 10a. The attachment holes 14b and 14d are respectively disposed in the front and rear end portions of the attachment portion 10b. The case 10 has a rectangular shape in bottom view. The attachment portions 10a and 10b are respectively disposed on the left and right sides of the case 10. Thus, the attachment holes 14a and 14c are respectively opposite to the attachment holes 14b and 14d. In addition, the attachment holes 14a and 14c are respectively opposite to the attachment holes 14d and 14b.

As illustrated in FIG. 1, the case 10 is fixed to the heat sink 1 with the screws 12 as passed through the attachment holes 14a, 14b, 14c, and 14d. The heat dissipation plate 3 is accordingly in contact with the heat sink 1 with the thermally conductive material 2 interposed therebetween. This facilitates the radiation of heat generated in the semiconductor elements 6 from the heat dissipation plate 3. It is noted that bushings may be fitted into the attachment holes 14a, 14b, 14c, and 14d, so that the screws 12 are engaged in the bushings.

Reference is made to FIGS. 3 and 4. The projections 11a and 11c individually project downward from the lower surface of the attachment portion 10a in positions more adjacent to the outer periphery of the attachment portion 10a than the attachment holes 14a and 14c. The projections 11b and 11d individually project from downward from the lower surface of the attachment portion 10b in positions more adjacent to the outer periphery of the attachment portion 10b than the attachment holes 14b and 14d. That is, the projections 11a, 11b, 11c, and 11d are disposed at the respective four corners of the case 10, which has a rectangular shape in bottom view.

Figure 5:
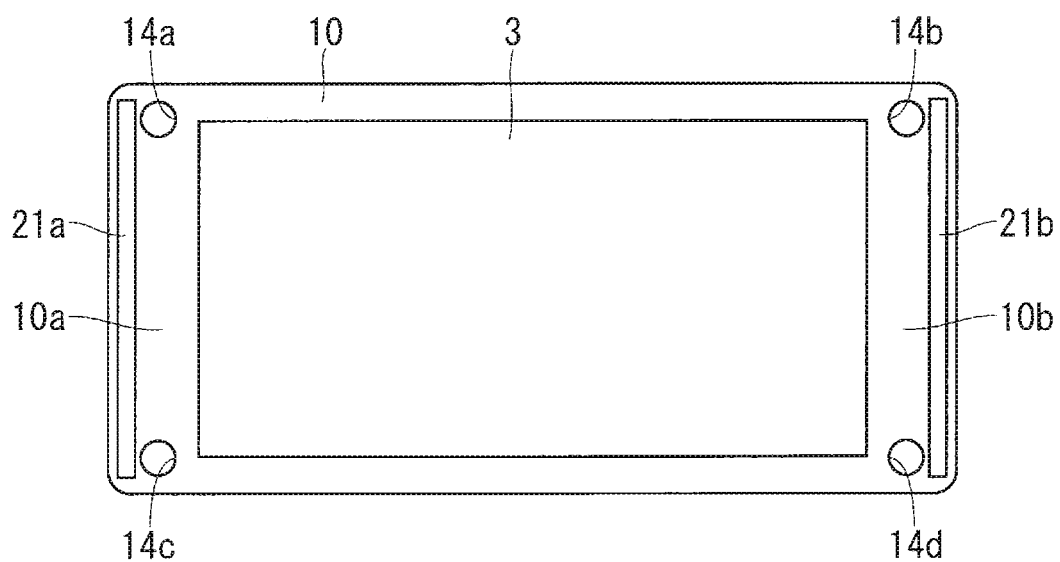
FIG. 5 is a bottom view of a semiconductor device according to a modification of the first preferred embodiment with the heat sink removed therefrom.

It is noted that the projections 11a, 11b, 11c, and 11d may be respectively provided for the attachment holes 14a, 14b, 14c, and 14d in a single form or a plural form. Alternatively, projections 21a and 21b may extend in respective longer-side directions of the attachment portions 10a and 10b, as illustrated in FIG. 5. FIG. 5 is a bottom view of a semiconductor device according to a modification of the first preferred embodiment with the heat sink 1 removed therefrom.

Figure 6:
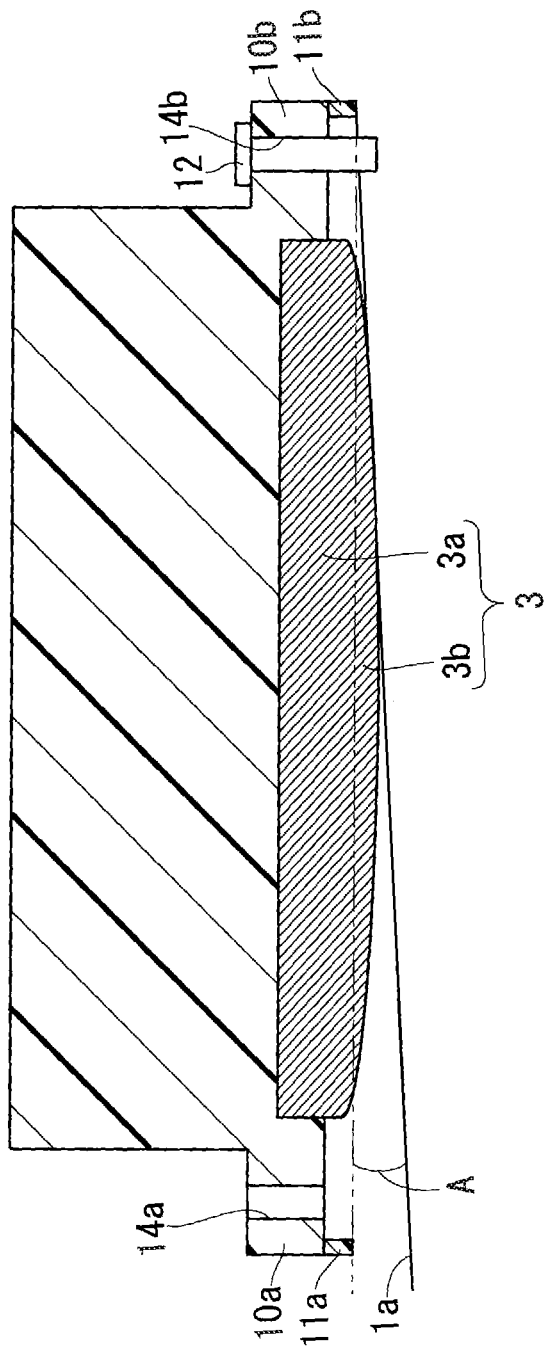
FIG. 6 is a simple cross-sectional view of the semiconductor device with one of attachment portions attached to the heat sink.
Figure 7:
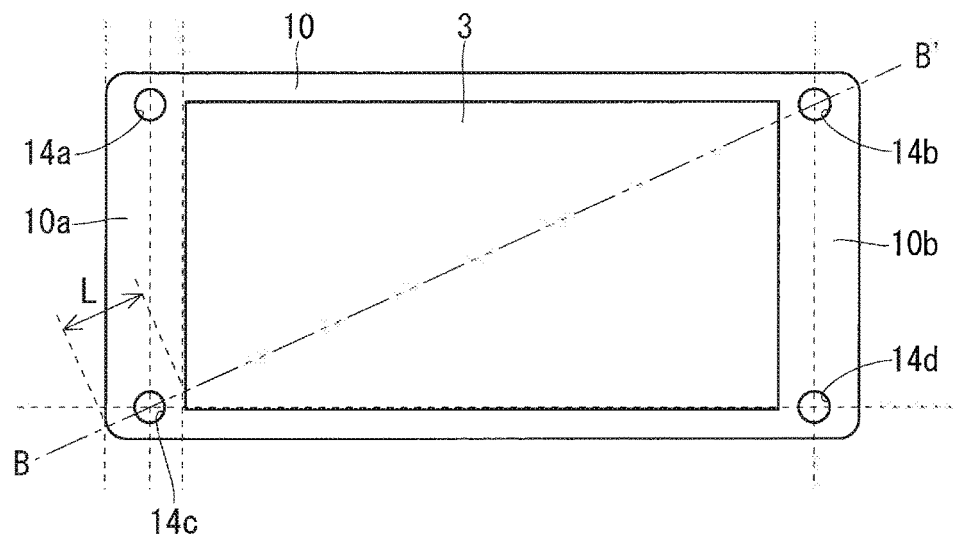
FIG. 7 is a bottom view of the semiconductor device, and illustrates an imaginary line B-B' connecting two attachment holes together and a horizontal distance L from the outer peripheral end of a case to the outer peripheral end of a heat dissipation plate.
Figure 8:
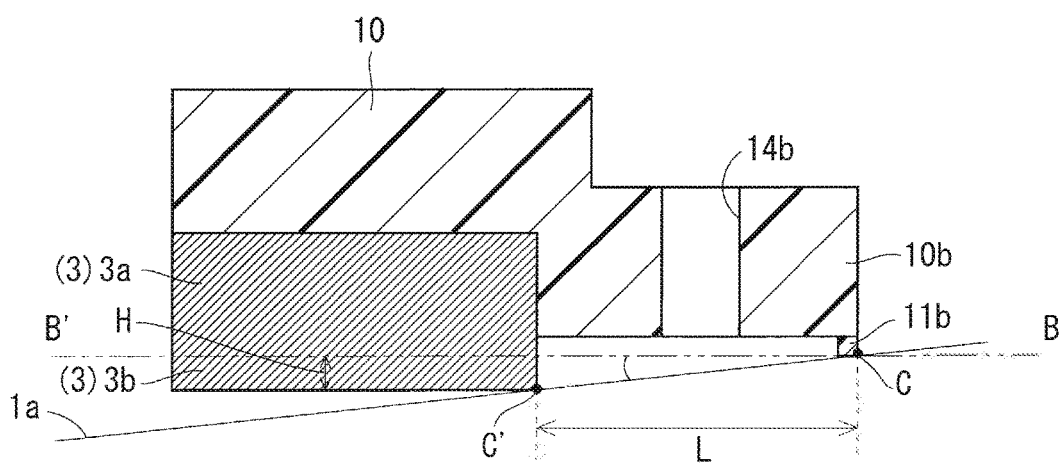
FIG. 8 is a cross-sectional view of the semiconductor device in a maximum angle A.

The following describes actions and effects of the semiconductor device according to the first preferred embodiment with reference to FIGS. 6, 7, and 8. FIG. 6 is a simple cross-sectional view of the semiconductor device with one of the attachment portions, the attachment portion 10*b* attached to the heat sink 1. FIG. 7 is a bottom view of the semiconductor device, and illustrates an imaginary line B-B' connecting the two attachment holes 14*b* and 14*c* together and a horizontal distance L from the outer peripheral end of the case 10 to the outer peripheral end of the heat dissipation plate 3. To facilitate the understanding of the bulge 3*b*, FIG. 6 illustrates the most bulging part of the bulge 3*b* at the center of the heat dissipation plate 3. In a practical semiconductor power module, however, the most bulging part is deviated from the center of the heat dissipation plate 3. An angle A is at its maximum when the most bulging part is at the outer peripheral end of the heat dissipation plate 3. FIG. 8 is a cross-sectional view of the semiconductor device in the maximum angle A. It is noted that FIG. 7 does not show the projections 11*a*, 11 *b*, 11*c*, and 11*d* for simple illustration.

As illustrated in FIGS. 6, 7, and 8, the angle A is an angle formed by the imaginary line B-B', connecting the two attachment holes 14*b* and 14*c* together, and an imaginary line C-C' with the screws 12 fastened to the heat sink 1 through the attachment holes 14*b* and 14*d*, where the imaginary line C-C' connects together a lowest point C of the projection 11*b* positioned in a surrounding portion of the attachment hole 14*b*, and a contact point C' between the bulge 3*b* and the heat sink 1. The upper limit of the angle A is defined, on the imaginary line B-B', by the horizontal distance L, from the outer peripheral end of the case 10 to the outer peripheral end of the heat dissipation plate 3, and by a vertical direction H between the lowest point C of the projection 11*b* and the contact point C' of the bulge 3*b*. Here, the contact point C' of the bulge 3*b* is a point at which the bulge 3*b* is in contact with a surface 1*a* of the heat sink 1 with the heat dissipation plate 3 placed upright without an inclination.

The distance H is obtained by subtracting a height T of the projection 11*b* from the sum of a bulge amount W of the bulge 3*b* and a vertical distance M between the lower end of the body 3*a* and the lower end of the case 10. Accordingly, the upper limit of the angle A is defined as indicated below. Here, the bulge amount W of the bulge 3*b* is a height from the upper end of the most bulging part of the bulge 3*b* to the lower end of the same.

$$H/L=\tan(A)$$

$$(M+W-T)/L=\tan(A)$$

$$A=\arctan((M+W-T)/L)$$

That is, the angle A satisfies the following expression:

$$0<A<\arctan((M+W-T)/L).$$

In a typical, industrial semiconductor power module, the value L is about 13 mm; and the value H, about 0.3 mm. The angle A is thus about 1.3 degrees.

Figure 21:
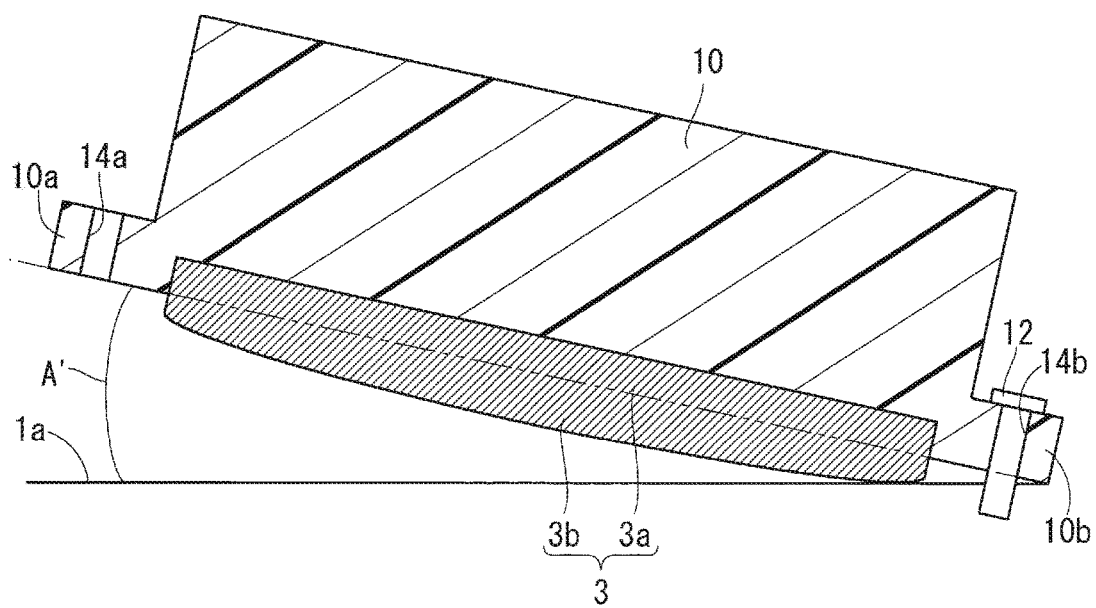
FIG. 21 is a simple cross-sectional view of a semiconductor device without a projection with one of attachment portions attached to a heat sink.

The following compares the semiconductor device with the projections 11*a*, 11*b*, 11*c*, and 11*d* to a semiconductor device without these projections. FIG. 21 is a simple cross-sectional view of the semiconductor device without the projections 11*a*, 11 *b*, 11*c*, and 11*d* with one of the attachment portions, the attachment portion 10*b* attached to the heat sink 1. As illustrated in FIG. 21, an angle A' with the screws 12 fastened to the heat sink 1 through the attachment holes 14*b* and 14*d* in the absence of the projections 11*a*, 11*b*, 11*c*, and 11*d* is larger than the angle A, illustrated in FIG. 6, in the presence of the projections 11*a*, 11 *b*, 11*c*, and 11*d*.

Here, the angle A' generally corresponds to the angle A with the following exception: the lowest point C of the projection 11*b*, positioned in the surrounding portion of the attachment hole 14*b*, is replaced with a lower surface at a corner positioned in a surrounding portion of the attachment hole 14*b*.

As described above, the semiconductor device according to the first preferred embodiment includes the projections 11*a*, 11 *b*, 11*c*, and 11*d*. The projections 11*b* and 11*d* support the semiconductor device body. This produces a small angle A. The small angle A prevents locations in which the attachment holes 14*a* and 14*c* in the attachment portion 10*a* of the case 10 are disposed from detaching upward from the surface 1*a* of the heat sink 1. This improves the attachment of the semiconductor device body to the heat sink 1, i.e., product attachment.

The projections 11*a*, 11*b*, 11*c*, and 11*d*, which are provided for the attachment holes 14*a*, 14*b*, 14*c*, and 14*d* in a single form or a plural form, stably support the semiconductor device body.

Second Preferred Embodiment

Figure 9:
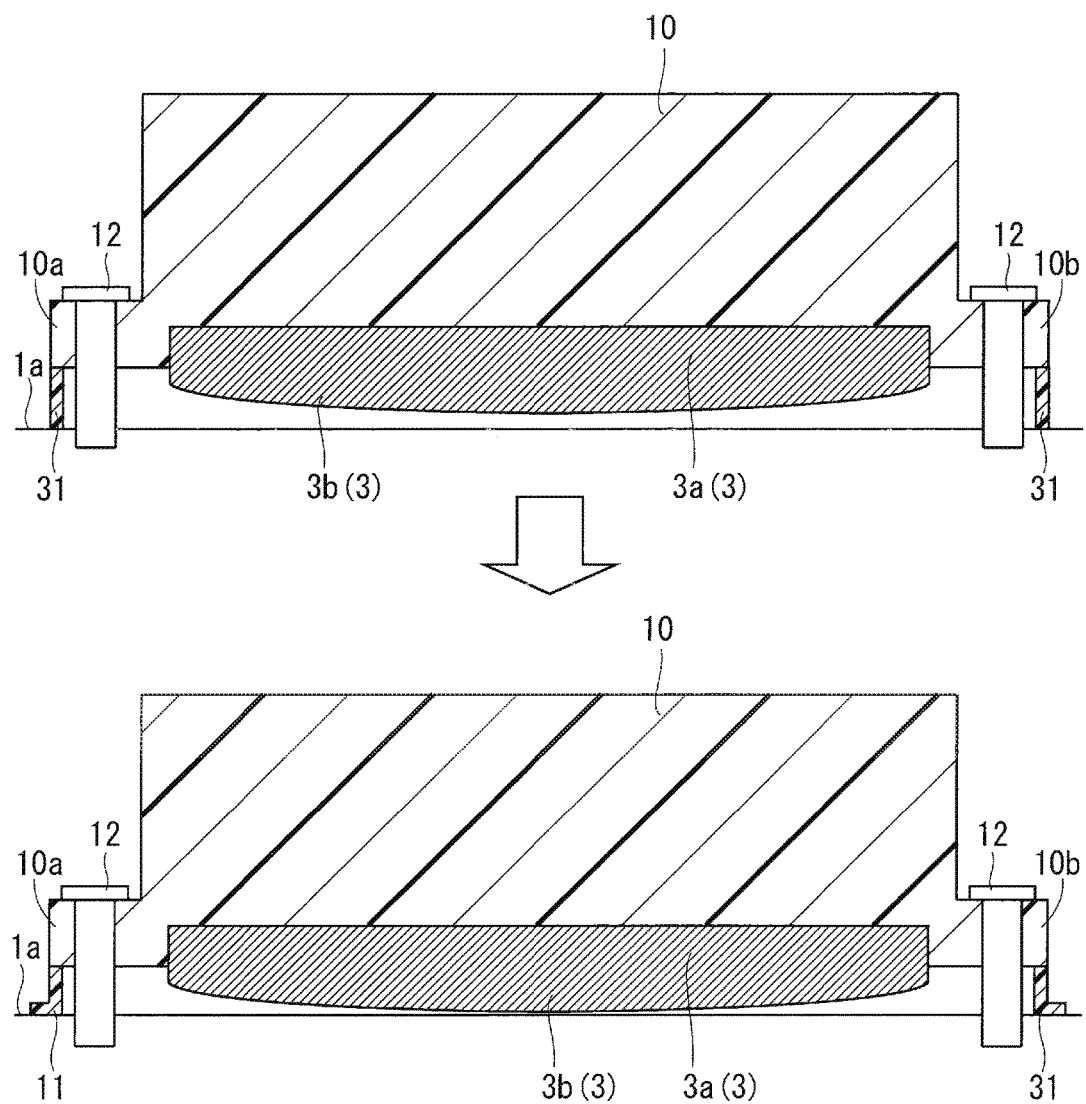
FIG. 9 is a simple cross-sectional view of a semiconductor device as screwed according to a second preferred embodiment.
Figure 10:
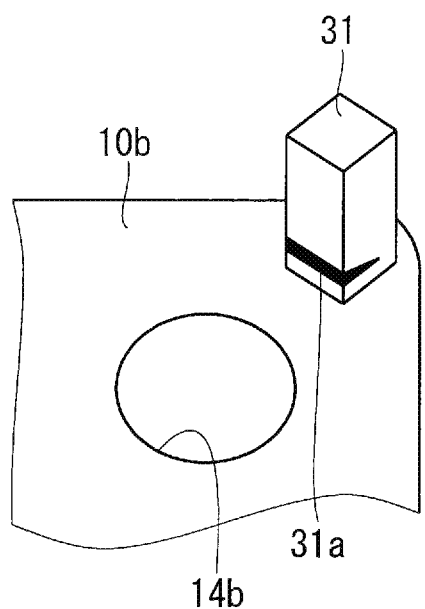
FIG. 10 is a perspective bottom view of a projection and its surrounding portion.

The following describes a semiconductor device according to a second preferred embodiment. FIG. 9 is a simple cross-sectional view of the semiconductor device as screwed according to the second preferred embodiment. FIG. 10 is a perspective bottom view of a projection 31 and its surrounding portion. It is noted that the same components between the first preferred embodiment and the second preferred embodiment are denoted by the same symbols, and will not be elaborated upon here.

In the second preferred embodiment, four projections 31 are bent outward by stress in the fastening of the screws 12, as illustrated in FIGS. 9 and 10.

The projections 31 are each made of a resin, such as a PPS. The projection 31 is provided with a horizontally extending cutout 31*a* in a position adjacent to the attachment hole 14*b* positioned in the surrounding portion of the projection 31. The cutout 31*a* facilitates the bending of the projection 31. The easy bending of the projection 31 thanks to the cutout 31*a* eliminates dimensional and material limitations of the projection 31. Further, the projection 31 is made of the same material as the case 10 and is integral with the case 10. The projection 31 is thus formed in the molding of the case. This reduces process steps, such as the production of the projection 31 and attachment. It is noted that the three other projections 31 are configured in the same manner.

As described above, the semiconductor device according to the second preferred embodiment includes the projections 31 each provided with the cutout in a position adjacent to the attachment hole. Accordingly, the following effects are achieved when the semiconductor device body is attached to the heat sink 1. The projection 31 firstly touches the surface 1*a* of the heat sink 1 in temporary fastening. This touch prevents the semiconductor device body from inclination. Additionally, the projection 31 is bent outward in actual fastening. This bending enables distance adjustment such that the heat dissipation plate 3 is in contact with the surface 1*a* of the heat sink 1. Consequently, optimal, thermal conductivity is achieved.

The distance adjustment such that the heat dissipation plate 3 is in contact with the heat sink 1 is achieved in variations in height of the projections 31, if any, at the time of manufacture. This prevents thermal conductivity deterioration, such as failed contact between the heat dissipation plate 3 and the surface 1a of the heat sink 1.

The projections 31, which are made of the same material as the case 10 and are integral with the case 10, are manufactured through process steps for manufacturing the case 10. This simplifies process steps for manufacturing the semiconductor device.

Third Preferred Embodiment

Figure 11:
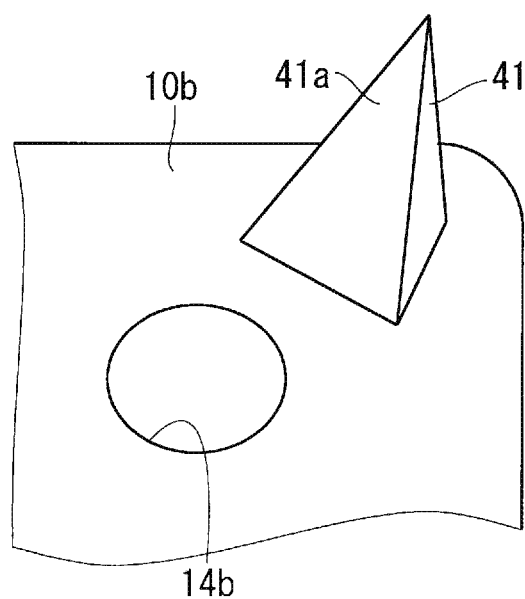
FIG. 11 is a perspective bottom view of a projection and its surrounding portion of a semiconductor device according to a third preferred embodiment.

The following describes a semiconductor device according to a third preferred embodiment. FIG. 11 is a perspective bottom view of a projection 41 and its surrounding portion of the semiconductor device according to the third preferred embodiment. FIG. 12 is a cross-sectional view of the projection 41 and its surrounding portion. It is noted that the same components between the first and second preferred embodiments, and the third preferred embodiment are denoted by the same symbols, and will not be elaborated upon here.

In the third preferred embodiment, four projections 41 are bent outward by stress in the fastening of the screws 12, as illustrated in FIGS. 11 and 12.

The projections 41 are each made of a resin, such as a PPS. The projection 41 is provided with an inclined portion 41a inclined toward an attachment-hole-14b side with respect to the lower surface of the attachment portion 10b so as to have a smaller width in the distal end portion of the projection 41 than in the proximal end portion of the projection 41. The inclined portion 41a facilitates the bending of the projection 41. It is noted that the three other projections 41 are configured in the same manner.

As described above, the semiconductor device according to the third preferred embodiment is configured such that the projections 41 are each provided with the inclined portion 41a inclined toward the attachment hole side with respect to the lower surface of the attachment portion so as to have a smaller width in the distal end portion than in the proximal end portion. Consequently, the projections 41 receive more horizontal stress in the fastening than the corresponding projections in the first preferred embodiment. Accordingly, the angle adjustment of the inclined portions 41a enables the bend degree of the projections 41 to be adjusted.

Fourth Preferred Embodiment

Figure 14:
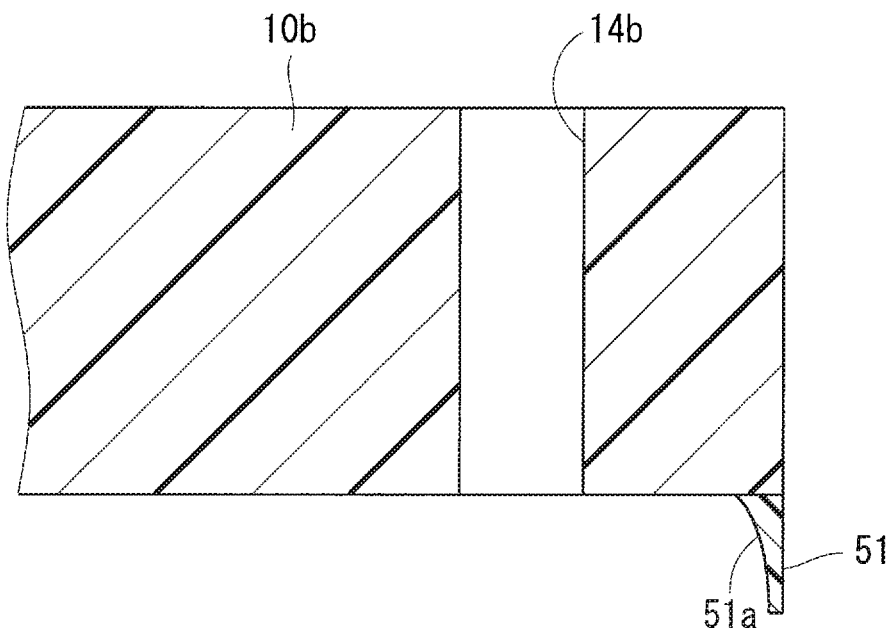
FIG. 14 is a cross-sectional view of the projection and its surrounding portion.

The following describes a semiconductor device according to a fourth preferred embodiment. FIG. 13 is a perspective bottom view of a projection 51 and its surrounding portion of the semiconductor device according to the fourth preferred embodiment. FIG. 14 is a cross-sectional view of the projection 51 and its surrounding portion. It is noted that the same components between the first to third preferred embodiments and the fourth preferred embodiment are denoted by the same symbols, and will not be elaborated upon here.

In the fourth preferred embodiment, four projections 51 are bent outward by stress in the fastening of the screws 12, as illustrated in FIGS. 13 and 14.

The projections 51 are each made of a resin, such as a PPS. The projection 51 is provided with a curved surface portion 51a dented toward the attachment-hole-14b side in the form of a curved surface. The curved surface portion 51a facilitates the bending of the projection 51. It is noted that the three other projections 51 are configured in the same manner.

As described above, the semiconductor device according to the fourth preferred embodiment includes the projections 51 each provided with the curved surface portion 51a dented toward the attachment hole side in the form of a curved surface. Consequently, the projections 51 receive more horizontal stress in the fastening than the corresponding projections in the first preferred embodiment. Accordingly, the curvature adjustment of the curved surface portions 51a enables the bend degree of the projections 51 to be adjusted.

Fifth Preferred Embodiment

Figure 15:
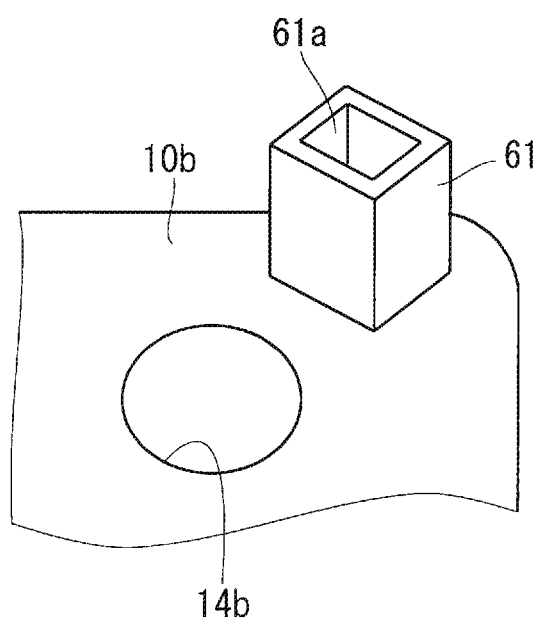
FIG. 15 is a perspective bottom view of a projection and its surrounding portion of a semiconductor device according to a fifth preferred embodiment.
Figure 16:
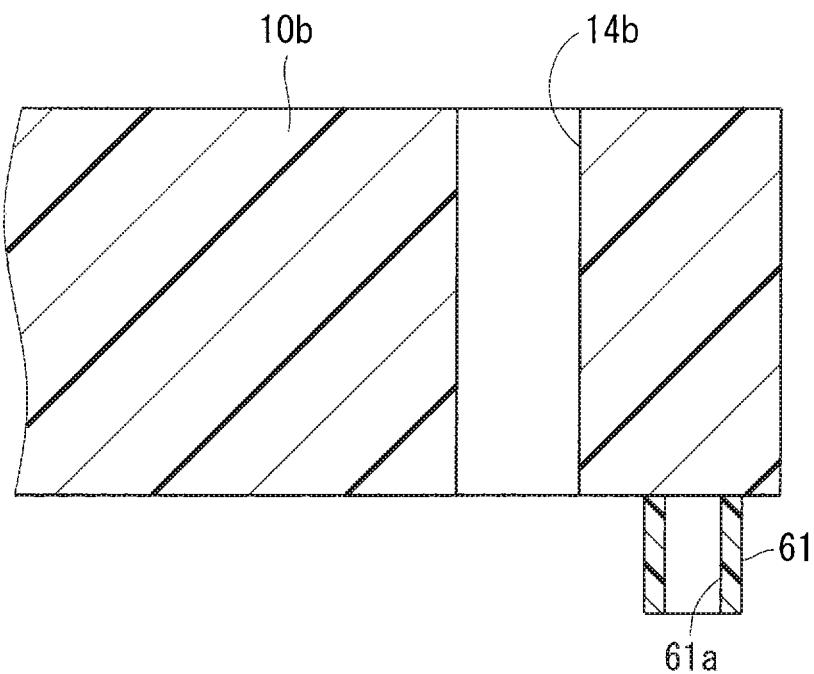
FIG. 16 is a cross-sectional view of the projection and its surrounding portion.

The following describes a semiconductor device according to a fifth preferred embodiment. FIG. 15 is a perspective bottom view of a projection 61 and its surrounding portion of the semiconductor device according to the fifth preferred embodiment. FIG. 16 is a cross-sectional view of the projection 61 and its surrounding portion. It is noted that the same components between the first to fourth preferred embodiments and the fifth preferred embodiment are denoted by the same symbols, and will not be elaborated upon here.

In the fifth preferred embodiment, four projections 61 are bent by stress in the fastening of the screws 12, as illustrated in FIGS. 15 and 16.

The projections 61 are each made of a resin, such as a PPS. The projection 61 is provided with a vertically extending hollow 61a whose lower surface is open. The hollow 61a facilitates the bending of the projection 61. It is noted that the three other projections 61 are configured in the same manner.

As described above, the semiconductor device according to the fifth preferred embodiment includes the projections 61 each provided with the hollow 61a extending in a vertical direction. Consequently, the dimensional adjustment of the hollows 61a enables the bend degree of the projections 61 to be adjusted.

Sixth Preferred Embodiment

Figure 17:
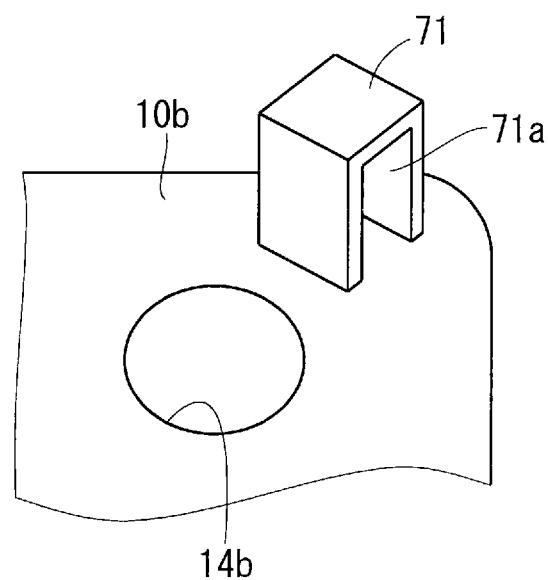
FIG. 17 is a perspective bottom view of a projection and its surrounding portion of a semiconductor device according to a sixth preferred embodiment.
Figure 18:
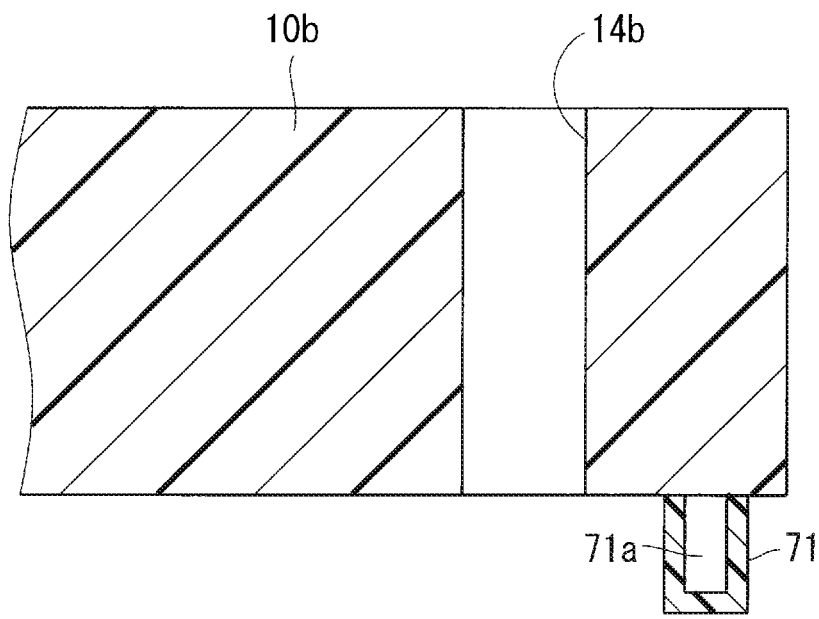
FIG. 18 is a cross-sectional view of the projection and its surrounding portion.

The following describes a semiconductor device according to a sixth preferred embodiment. FIG. 17 is a perspective bottom view of a projection 71 and its surrounding portion of the semiconductor device according to the sixth preferred embodiment. FIG. 18 is a cross-sectional view of the projection 71 and its surrounding portion. It is noted that the same components between the first to fifth preferred embodiments and the sixth preferred embodiment are denoted by the same symbols, and will not be elaborated upon here.

In the sixth preferred embodiment, four projections 71 are bent by stress in the fastening of the screws 12, as illustrated in FIGS. 17 and 18.

The projections 71 are each made of a resin, such as a PPS. The projection 71 is provided with a horizontally extending hollow 71a whose side surfaces opposite to each other are open. The hollow 71a facilitates the bending of the projection 71. It is noted that the three other projections 71 are configured in the same manner.

As described above, the semiconductor device according to the sixth preferred embodiment includes the projections 71 each provided with the hollow 71a extending in a horizontal direction. Consequently, the dimensional adjustment of the hollows 71a enables the bend degree of the projections 71 to be adjusted.

Seventh Preferred Embodiment

Figure 19:
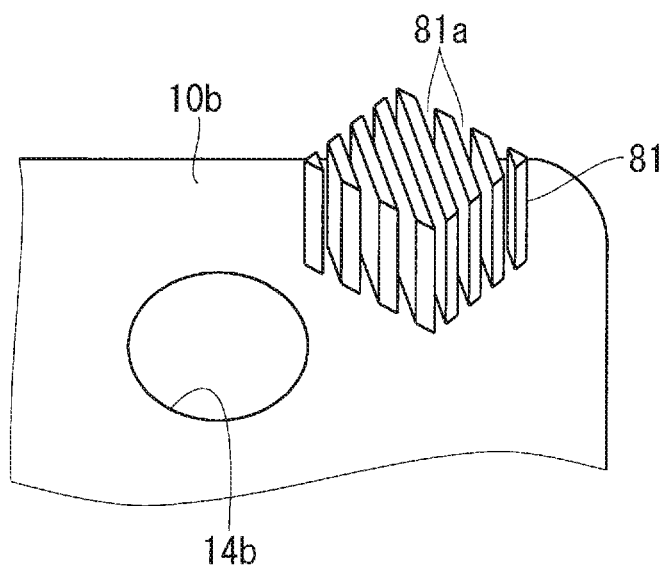
FIG. 19 is a perspective bottom view of a projection and its surrounding portion of a semiconductor device according to a seventh preferred embodiment.
Figure 20:
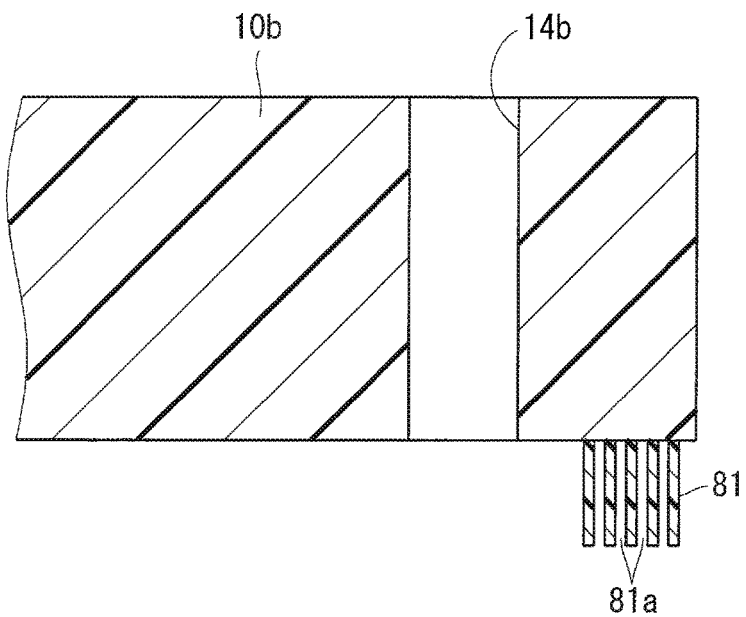
FIG. 20 is a cross-sectional view of the projection and its surrounding portion.

The following describes a semiconductor device according to a seventh preferred embodiment. FIG. 19 is a perspective bottom view of a projection 81 and its surrounding portion of the semiconductor device according to the seventh preferred embodiment. FIG. 20 is a cross-sectional view of the projection 81 and its surrounding portion. It is noted that the same components between the first to sixth preferred embodiments and the seventh preferred embodiment are denoted by the same symbols, and will not be elaborated upon here.

In the seventh preferred embodiment, four projections 81 are bent by stress in the fastening of the screws 12, as illustrated in FIGS. 19 and 20.

The projections 81 are each made of a resin, such as a PPS. The projection 81 is provided with a plurality of grooves 81a extending in a vertical direction. The plurality of grooves 81a facilitate the bending of the projection 81. It is noted that the three other projections 81 are configured in the same manner.

As described above, the semiconductor device according to the seventh preferred embodiment includes the projections 81 each provided with the plurality of grooves 81a extending in a vertical direction. Consequently, the adjustment of the width, interval, depth, and angle of each groove 81a enables the bend degree of the projections 81 to be adjusted.

It is also noted that in the present invention, the individual embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a heat sink;
   a heat dissipation plate disposed above the heat sink;
   a semiconductor element disposed above the heat dissipation plate; and
   a case enclosing the semiconductor element and attached to the heat sink,
   wherein the heat dissipation plate has
      a body being flat shaped, and
      a bulge bulging out from a lower end of the body in a form of an arc in cross-sectional view,
   wherein the case has
      an attachment portion extending outward from an outer periphery portion at a lower end portion of the case,
      two attachment holes disposed in positions opposite to each other in the attachment portion, and provided for attachment to the heat sink, and
      two projections individually projecting downward from a lower surface of the attachment portion in positions more adjacent to an outer periphery side of the attachment portion than the two attachment holes, and
   wherein the following expression is satisfied by an angle A formed by an imaginary line connecting the two attachment holes together and an imaginary line connecting together a lowest point of one of the two projections positioned in a surrounding portion of one of the two attachment holes and a contact point between the bulge and the heat sink, with a screw fastened to the heat sink through the one attachment hole, where M represents a vertical distance between the lower end of the body and the lower end of the case, where W represents a bulge amount of the bulge, where T represents a height of the projection, where L represents a horizontal distance from an outer peripheral end of the case to an outer peripheral end of the heat dissipation plate:

$$0<A<\arctan((M+W-T)/L).$$

2. The semiconductor device according to claim 1, wherein the projections are each provided for the attachment hole in a single form or a plural form.

3. The semiconductor device according to claim 2, wherein the projections each have a cutout on an attachment hole side.

4. The semiconductor device according to claim 2, wherein the projections are each made of the same material as the case and each provided to be integral with the case.

5. The semiconductor device according to claim 2, wherein the projections each have an inclined portion inclined toward an attachment hole side with respect to the lower surface of the attachment portion so as to have a smaller width in a distal end of the projections than in a proximal end of the projections.

6. The semiconductor device according to claim 2, wherein the projections each have a curved surface portion dented toward an attachment hole side in a form of a curved surface.

7. The semiconductor device according to claim 2, wherein the projections each have a hollow extending in a vertical direction.

8. The semiconductor device according to claim 2, wherein the projections each have a hollow extending in a horizontal direction.

9. The semiconductor device according to claim 2, wherein the projections each have a plurality of grooves extending in a vertical direction.

10. The semiconductor device according to claim 1, wherein one of the projections directly contacts the heat sink and is configured to support the case and the heat dissipation plate above the heat sink.

11. The semiconductor device according to claim 1, wherein the projections are each spatially separated from the heat dissipation plate.

* * * * *